United States Patent [19]
Bennett et al.

[11] Patent Number: 6,077,645
[45] Date of Patent: Jun. 20, 2000

[54] PRODUCTION OF WATER-LESS LITHOGRAPHIC PLATES

[75] Inventors: Peter Andrew Reath Bennett, N. Yorks; Carole-Anne Smith, West Lothian; Stuart Bayes, Leeds, all of United Kingdom

[73] Assignee: Kodak Polychrome Graphics LLC, Norwalk, Conn.

[21] Appl. No.: 09/155,019

[22] PCT Filed: Mar. 19, 1997

[86] PCT No.: PCT/GB97/00758

§ 371 Date: Jan. 26, 1999

§ 102(e) Date: Jan. 26, 1999

[87] PCT Pub. No.: WO97/36208

PCT Pub. Date: Oct. 2, 1997

[30] Foreign Application Priority Data

Mar. 23, 1996 [GB] United Kingdom .................. 9606182

[51] Int. Cl.[7] .............................. G03C 1/72; G03C 1/76; G03F 7/26; G03F 7/20
[52] U.S. Cl. ..................................... 430/271.1; 430/270.1; 430/280.1; 430/303
[58] Field of Search ..................................... 430/302, 303, 430/909, 911, 905, 914, 280.1, 271.1, 270.1

[56] References Cited

U.S. PATENT DOCUMENTS 5,849,369 12/1998 Ogawa ..................................... 427/539

FOREIGN PATENT DOCUMENTS

| 0 349 157 | 1/1990 | European Pat. Off. . |
| 0 377 175 | 7/1990 | European Pat. Off. . |
| 41 10 181 | 10/1991 | Germany . |
| 57-176044 | 10/1982 | Japan . |

OTHER PUBLICATIONS

International Search Report for PCT/GB97/00758.

*Primary Examiner*—Janet Baxter
*Assistant Examiner*—Sin J. Lee
*Attorney, Agent, or Firm*—Ostrager Chong Flaherty & Flaherty

[57] ABSTRACT

There is described a water-less lithographic plate precursor which comprises on an aluminium plate a light-sensitive composition which comprises a polymer with hydroxy functional groups, an acid generator which when light exposed yields an acid together with a silyl ether of general formula (I), where Rf is a fluoroaliphatic group having 3 to 10 carbon atoms, Y is oxygen, $SO_2$, carbonyl or a direct link, X is N $R_4$ where $R_4$ is hydrogen or lower alkyl having up to six carbon atoms or is a direct link, each of $R_1$, $R_2$ and $R_3$ are lower alkyl groups having up to six carbon atoms and $R_5$ is a lower alkyl group having up to six carbon atoms.

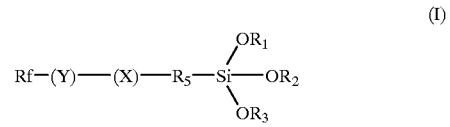

8 Claims, No Drawings

PRODUCTION OF WATER-LESS LITHOGRAPHIC PLATES

Lithographic plates may be divided into two classes. Those which require dampening water which is fed to the non-image areas of the plate, forms a water film and acts as an ink-repellant layer; this is the so-called fount solution. Those plates which require no fount solution are called driographs or water-less lithographic plates. Most lithographic plates at present in use are of the first type and require a fount-solution during printing. However, lithographic plates of this type suffer from a number of disadvantages. Some of these are:

a) adjustment of the proper ink-water balance during press operation is difficult and requires great experience. If the correct ink-water balance is not achieved scumming is occasioned when the printed ink image extends into the non-image areas ruining the printed image.

b) adjustment of the ink-water balance at start-up or re-start up is particularly difficult and can not be stabilised until a large number of sheets have been printed, thus incurring waste, c) the ink tends to become emulsified which leads to poor adherence of the ink on to the plate which causes problems in colour reproduction and in dot reproduction, d) the printing press has to be provided with a dampening system, thus increasing its size and complexity.

e) The plate care chemistry and fount solutions require careful control and selection. Further plate cleaners contain significant levels of solvent which is not desirable.

However, with water-less plates in which the ink-releasing layer is, for example, a cured silicone layer or a fluoroalkyl compound there is no scumming and clearer images can be produced. Very often water-less plates comprise a base material, for example aluminium plate, on which a photosensitive layer is coated, on this photosensitive layer there is coated a silicone layer or a fluoroalkyl compound. After imagewise exposure and development in which selected areas of the photosensitive composition are altered, the overlying silicone or fluoroalkyl compound layer is removed and the plate is inked up. The ink adheres only to those areas of the plate not covered by the silicone or fluoroalkyl compound remaining after development. Thus the plate can be used without a fount solution.

However, in practice it has proved difficult to get the silicone or fluoroalkyl compound layer composition to adhere to the photosensitive layer. In spite of the idea of water-less plates having been described in patent specifications for at least fifteen years very little has been done to commercialise the idea and water-less plates which have been and are being sold are more expensive than the conventional plates which require a fount solution.

In E.P. 349 157 a water-less presensitised lithographic printing plate is disclosed. The plate comprises a support having thereon a light sensitive layer and a silicone rubber layer in this order, wherein said silicone rubber layer contains a copolymer having a silicone monomer and fluorine-containing monomer in its molecular structure. In JP A 5717 6044 there is disclosed a lithographic plate comprising a hydrophobic film consisting of a silanol oligomer and an organic high polytmer.

We have developed a water-less lithographic plate which is different in concept to the hereinbefore proposed water-less lithographic plates and furthermore a plate which requires no wet processing.

Therefore according to the present invention there is provided a water-less lithographic plate precursor which comprises on a base material having in one or two layers a light-sensitive composition which comprises a polymer with hydroxy functional groups, an acid generator which when light exposed yields an acid together with a silyl ether of the general formula I:

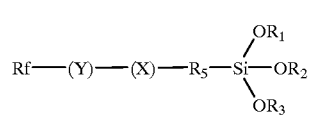

where Rf is a fluoroaliphatic group having 3 to 10 carbon atoms, Y is selected from —O—, —$SO_2$—, —CO— and a direct link, X is selected from —N—$R_4$ where $R_4$ is hydrogen or lower alkyl having up to six carbon atoms and a direct link, each of $R_1$, $R_2$ and $R_3$ are lower alkyl groups having up to six carbon atoms and $R_5$ is a lower alkyl group having up to six carbon atoms.

Preferably each of $R_1$, $R_2$ and $R_3$ are the same.

The light-sensitive composition of the present invention may be U-V light sensitive, visible light sensitive or infra-red radiation sensitive. When the composition is infra-red light sensitive there should be present in the composition an infra-red light absorbing compound.

According to another feature of the present invention there is provided a method of producing a water-less lithographic plate which comprises imagewise exposing the above set forth plate precursor to UV or visible light and the above set forth composition which also comprises an infra-red absorbing compound to IR radiation to generate an acid and then heating the imagewise exposed composition to over 100° C. and then inking up the plate using an inking roller and water-less ink. Preferably after light-exposure the composition on the plate is heated at 130° C. for three minutes. Conveniently this heating can be carried out in a baking oven of the conventional type.

It is thought that the release surface of the plate is formed by the silyl ether compound reacting with the hydroxyl groups of the polymer in those areas of the plate which have been imagewise exposed. The acid generated during the imagewise exposure hydrolyses the alkoxy $OR_1/OR_2/OR_3$ groups on the silyl ether compound to form an oligomer via a condensation reaction. This oligomer adsorbs on to the polymer by hydrogen bonding. The heating step converts these hydrogen bonds to covalent bonds by the elimination of water. This yields a low surface energy film formed by the Rf groups present on the surface of the plate.

Thus no wet-processing is required to form the water-less lithographic plate.

The step of working-up the plate, after the heating step, by using a roller and water-less ink removes the unreacted silyl ether compound from the surface of the plate. However, it is possible to include a wet-development step before inking-up. Useful developers include silicate based developing solutions of the type well known in the trade and water.

By an acid generator which when light exposed means a compound together with in some cases a light absorbing compound which when light-exposed to UV, visible or IR radiation generates an acid.

Useful compounds of this type are triazines of the general formula II:

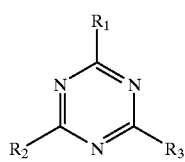

wherein $R_1$ is a substituted or unsubstituted aliphatic or aromatic group and $R_2$ and $R_3$ are each a haloalkyl group.

An example of a triazine of this type is 2(4-methylthiophenyl)-4,6-trichloromethyl-s-triazine.

Other useful acid generator compounds include diazonium salts for example 4-diazo diphenylamine hexafluorophosphate and iodonium compounds for example diphenyl iodonium iodide. Other examples of acid generators include sulphonium, phosphonium, selenonium, arsonium salts and salts of fluorophosphoric acid.

Another group of useful acid generator compounds are the so-called Lewis acids.

When acid generator compounds as just set forth are exposed to UV light an acid will be generated. However, if the imagewise exposure is to be IR light an IR absorber is required to be present in the composition. Similarly if the imagewise exposure is to be visible light a sensitizer such as a titanocene compound or a ketocoumarin compound which absorbs light in the region of the exposing visible light is required.

Useful infra-red light absorbers include carbon black, small metal particles for example iron or copper and thin metal films for example aluminium or platinum and dyes for example:

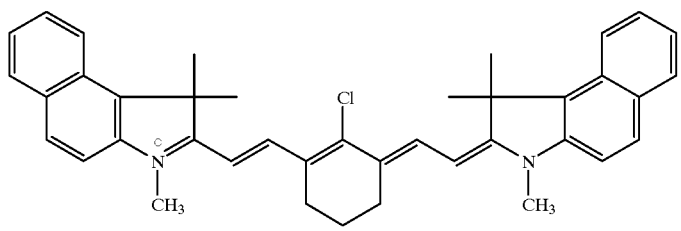

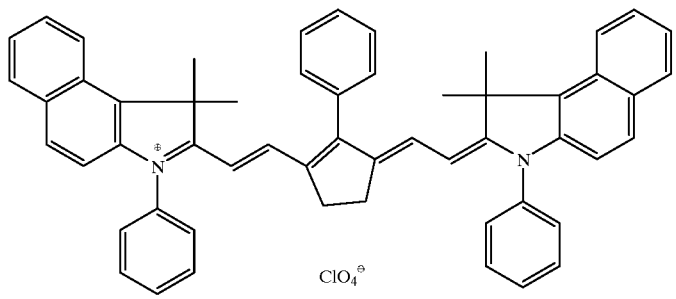

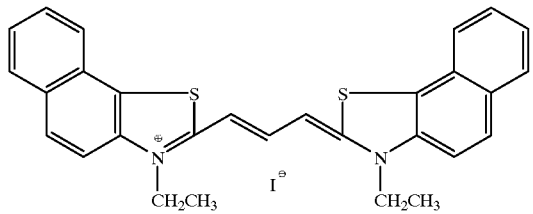

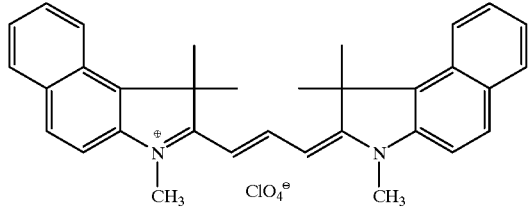

By polymer having hydroxy functional groups is meant a polymer having hydroxy groups which when heated in the presence of another compound having hydroxy groups is capable of condensation therewith with the elimination of water.

Examples of polymers with hydroxy functional groups include novolac resins, hydroxypropyl cellulose, polyvinyl butyral, some epoxy resins and polyvinyl alcohol.

The invention is described by the following examples.

In examples 1–8 silyl ether A as set forth above was used in the composition. The acid generator compound was a triazine.

It is to be understood that the light-sensitive composition coated on the aluminium plate can be coated in two layers as described in Example 11 which follows.

EXAMPLE 1

Onto a piece of anodised, ungrained aluminium substrate a solution of composition 1 was coated using a metered wire bar and dried at 100° C. for 1 minute.

Composition 1

1.2 g of a solution of novolac resin LB744 (supplied by Bakelite)—10% solids in 1-methoxy propan-2-ol.

0.46 g of a solution of 2(4-methylthiophenyl)-4,6-trichloromethyl-s-triazine—3% solids in 2-methoxyethyl acetate.

0.12 g of a solution of silyl ether A—60% solution in ethanol.

This solution was mixed for 15 minutes prior to coating.

The plate was then exposed to UV radiation through a mask and heated in an oven at 130° C. for 3 minutes. After cooling the plate was inked up with a rubber roller and waterless ink to give a positive plate with clean release and strongly inked image areas.

EXAMPLE 2

As example 1 but using a 10% solids solution of hydroxy propyl cellulose in 1-methoxy-propan-2-ol for the novolac resin.

EXAMPLE 3

As example 1 but using a 10% solids solution of poly (vinylbutyral) in 1-methoxy-propan-2-ol substituted for the novolac resin.

EXAMPLE 4

As Example 1 but using a 10% solids solution of Epikote 1004 resin (as supplied by Asto Stag Ltd.) in a solvent mixture of 9 parts methyl lactate to 1 part benzyl alcohol instead of the novolac resin.

EXAMPLE 5

As examples 1 and 3 but using grained and anodised aluminium substrate.

EXAMPLE 6

Onto a piece of anodised, ungrained aluminium substrate a solution of composition 2 (see below) was coated using a metered wire bar and dried at 100° C. for 1 minute.

Composition 2

0.6 g—2A 0.06 g—Silyl ether A 60% solids in ethanol.

This coating was mixed for 15 minutes.

Composition 2A 0.6 g of a solution of Epikote 1004 (as supplied by Astro Stag Ltd.)—25% solids in a solvent mixture of 9 parts methyl lactate to 1 part benzyl alcohol.

0.3 g DS019 (as supplied by PCAS).

2.6 g of 9:1 methyl lactate:benzyl alcohol.

(DS019 is a diazonium compound and was used in this example in place of the triazine compound as the acid generator compound.)

The resultant plate was exposed to U.V. radiation through a mask and then heated in an oven at 130° C. for 80 seconds. After cooling the plate was inked up using a rubber roller and waterless ink to give a positive plate with a clean release and strongly inked image area.

EXAMPLE 7 (IR+UV exposure)

Onto a piece of anodised, ungrained aluminium substrate a solution of composition 3 was coated using a metered wire bar and dried at 100° C. for 1 minute.

Composition 3

0.6 g of composition 2A.

0.18 g of IR sensitiser II—3.2% in dimethyl formamide.

0.06 g of silyl ether A-60% solution in ethanol.

This coating was mixed for 15 minutes. The coated plate was divided into two halves referred to as 3A and 3B.

Plate 3A was exposed to IR light directly and heated in an oven at 130° C. for 80 seconds.

Plate 3B was imaged using UV light then heated at 130° C. for 80 seconds.

Both plates 3A and 3B were inked up using a rubber roller and waterless ink to yield positive plates, no processing was employed.

The presence of the IR sensitiser did not affect the sensitivity of the plate to UV exposure.

The plates of the present invention which comprise an IR absorbing compound can be digitally imaged using an IR emitting laser in an image setter.

Thus the plate prepared in this Example can either be placed in an image setter and be digitally imaged or placed in an image frame and be imaged by U.V. light through a mask.

EXAMPLE 8

Wet Development Before Inking-up

Formulation as for Example 6

The plate was exposed to UV radiation through a mask and heated in an oven at 130° C. for 80 seconds. The plate was then developed for 30 seconds using water, after drying the plate was inked to yield a positive plate.

EXAMPLE 9

Alternative Silyl Ethers

| | |
|---|---|
| Composition 9A | 0.6 g of composition 2A |
| | 0.04 g of silyl ether B |
| Composition 9B | 0.6 g of composition 2A |
| | 0.04 g of silyl ether C |

The above compositions were mixed for 15 minutes, then coated onto a piece of grained and anodised aluminium with a metered wire bar and dried at 100° C. for 1 minute.

The coatings were exposed to UV radiation through a mask then heated in an oven at 130° C. for 180 seconds. The resultant plates each gave good image/background discrimination on inking without the need for water.

EXAMPLE 10

Non-condensed Diazonium Salt

Composition 10 was coated onto aluminium substrate using a metered wire bar and dried at 100° C. for 60 seconds.

Composition 10

0.25 g—10% w/w solids Epikote 1004 in methyl lactate-:benzyl alcohol (9:1)

0.19 g—10% w/w LDN1PF6 diazonium salt (Varichem Ltd) in DMF 0.06g—60% of silyl ether a in ethanol The above composition was mixed for 15 minutes, prior to coating.

The coated plate was exposed to UV light through a mask and then heated at 100° C. for 1 minute. The resultant plate, on inking, gave good image/non image discrimination without the need for dampening.

EXAMPLE 11

Two Layer Coating

Composition 2A was coated onto grained and anodised aluminium using a metered wire bar and was dried at 100° C. for 1 minute. This was then over-coated with Composition 11 using a metered wire bar and dried at 100° C. for 60 seconds.

Composition 11

Silyl ether A (60% solids in ethanol) diluted to 6% with cyclohexane.

The resultant plate was exposed through a mask to UV light and then heated at 130° C. for 80 seconds. Good image/non image discrimination was seen on inking without the use of dampening solution.

EXAMPLE 12

IR Sensitised Using Carbon Black

Composition 12 was coated onto grained and anodised aluminium using a metered wire bar and dried at 100° C. for 1 minute.

Composition 12

0.75 g of 20% w/w carbon black/epikote 1004 solution in 9:1 methyl lactate: benzyl alcohol.

0.3 g of 100% DSO19

0.67 g of 100% dimethylformamide 1.38 g of 9:1 methyl lactate: benzyl alcohol

The composition of the 20% carbon black/epikote solution was:

0.34 g of carbon black FW1 (supplied by Degussa AG)

0.66 g of 100% epikote 1004

3.60 g of methyl lactate 0.4 g benzyl alcohol

The carbon black was dispersed by ball milling it into the solution.

This was then over coated with Composition 11 using a metered wire bar and dried at 100° C. for 30 seconds. The resultant plate was imaged using a 200 mW, 850 nm laser and baked at 130° C. for 80 seconds.

The plate was developed and inked by applying waterless ink with a roller to give good image discrimination without the need for damping.

EXAMPLE 13

IR Sensitised Using a Thin Metal Film

Composition 2A was coated onto the metallised side of (a) an aluminised polyester (supplied by HiFi) or (b) a polyester sheet (supplied as Planfoil by Horsell Graphic Industries) sputter coated with a thin layer of platinum. The coating was dried at 100° C. fr 1 minute.

These were then over coated with Composition 11 using a metered bar and dried at 100° C. for 30 seconds The plates obtained were imaged using a 200 mW 830 nm laser and baked at 130° C. for 80 seconds. On inking using waterless ink and a roller with no damping applied, positive plates were produced with good image/non-image discrimination

What is claimed is:

1. A water-less lithographic plate precursor which comprises on a base material having in one or two layers a light sensitive composition which comprises a polymer selected from a polymer with hydroxy groups, a polyvinyl butyral and an epoxy resin, an acid generator compound which on exposure to radiation generates an acid and a silyl ether of the general formula I:

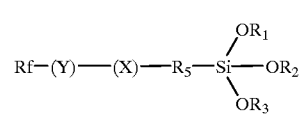

I where Rf is a fluoroaliphatic group having 3 to 10 carbon atoms, Y is selected from —O—, —SO$_2$—, —CO— and a direct link, X is selected from —NR$_4$ where R$_4$ is hydrogen or lower alkyl having up to six carbon atoms and a direct link, each of R$_1$, R$_2$ and R$_3$ are lower alkyl groups having up to six carbon atoms and R$_5$ is a lower alkyl group having up to six carbon atoms.

2. A water-less lithographic plate precursor according to claim 1 wherein in the silyl ether of formula IR$_1$, R$_2$ and R$_3$ are the same.

3. A water-less lithographic plate precursor according to claim 2 wherein R$_1$, R$_2$ and R$_3$ are each methyl or ethyl.

4. A waterless lithographic plate precursor according to claim 1, wherein the acid generator is a triazine of the general formula II:

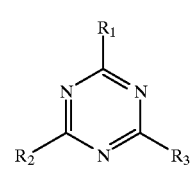

II wherein R$_1$ is a substituted or unsubstituted aliphatic or aromatic group and R$_2$ and R$_3$ are each a haloalkyl group.

5. A waterless lithographic plate precursor according to claim 1, wherein the acid generator is selected from a diazonium salt, an iodonium compound, a sulphonium compound, a phosphonium compound, a selonium compound, an arsonium compound and a salt of a fluorophosphoric acid.

6. A waterless lithographic plate precursor according to claim 1, wherein said polymer is selected from a novolac resin, an hydroxypropyl cellulose, a polyvinyl butyral, an epoxy resin and a polyvinyl alcohol.

7. A method of producing a water-less lithographic plate which method comprises imagewise exposing the plate precursor as claimed in claim 1 to UV or visible light and the above set forth composition which may also comprise an infra-red absorbing compound to IR light to generate an acid and then heating the imagewise exposed composition to over 100° C. and then inking up the plate using an inking roller and water-less ink.

8. A method according to claim 7 wherein after light exposure the composition on the base is heated at 130° C. for three minutes.

* * * * *